United States Patent [19]

Huang et al.

[11] Patent Number: 4,568,630

[45] Date of Patent: Feb. 4, 1986

[54] METHOD FOR PREPARING AND USING AN ANODIZED ALUMINUM PHOTO-LITHOGRAPHIC PRINTING PLATE

[75] Inventors: Jen-chi Huang, Ossining; Eugene Golda, Monsey, both of N.Y.

[73] Assignee: Polychrome Corporation, Yonkers, N.Y.

[21] Appl. No.: 644,077

[22] Filed: Aug. 24, 1984

[51] Int. Cl.[4] .......................... G03F 7/02; G03F 7/08

[52] U.S. Cl. .................................... 430/302; 430/159; 430/166; 430/169; 430/276; 430/278; 430/309; 204/17; 204/35.1; 204/38.3; 204/58

[58] Field of Search ............... 430/159, 166, 169, 276, 430/278, 302, 309; 204/17, 35.1, 38 A, 58

[56] References Cited

U.S. PATENT DOCUMENTS 3,266,900 8/1966 Zelley ................................ 430/276
3,549,365 12/1970 Thomas ................................ 430/302
4,191,570 3/1980 Herting et al. ...................... 430/302
4,230,492 10/1980 Thomas ................................ 430/159
4,376,814 3/1983 Walls .................................. 430/276
4,446,221 5/1984 Herting et al. ...................... 430/302

OTHER PUBLICATIONS

Technical Data Sheet for Tamol SN(6-0224), Rohm & Haas Co., no date given.

*Primary Examiner*—Charles L. Bowers, Jr.

[57] ABSTRACT

A method of preparing an anodized aluminum printing plate comprising treating the aluminum support with aqueous solution of a condensed aryl sulfonic acid having a neutral pH, anodizing the support before or after the treating step, and coat, radiation expose through a mask, as well as develop a radiation-sensitive composition to produce the lithographic printing plate.

3 Claims, No Drawings

METHOD FOR PREPARING AND USING AN ANODIZED ALUMINUM PHOTO-LITHOGRAPHIC PRINTING PLATE

The present invention relates to an improved method for manufacturing lithographic printing plates. More particularly, -the invention pertains to a method which comprises treating an anodized metal support with an aqueous solution of an alkali metal salt of a condensed arylsulfonic acid prior to coating said metal support with a radiation sensitive composition.

BACKGROUND OF THE INVENTION

U.S. Pat. No. 4,446,221 which issued to Herting et al. is directed to an improved lithographic printing plate which comprises treating an anodized metal plate with an aqueous solution of an alkali metal salt of a condensed arylsulfonic acid having an acidic pH prior to coating the metal plate with a radiation-sensitive composition. Herting et al. discuss in columns 1 and 2 of the patent certain problems encountered in the prior art methods for coating a radiation-sensitive materials onto a lithographic plate. It is stated there that radiation sensitive elements which may be converted to lithographic printing plates comprise a radiation sensitive layer in which the printing image is photomechanically produced; and a suitable support which from the production of the material until its processing into a printing plate, carries the radiation-sensitive layer and is stored therewith until the material is used. After the production of the printing image, the support carries the printing image and simultaneously forms the image background in the image-free areas. A suitable support for a printing plate is one where the printing image areas developed from the radiation-sensitive layers must adhere very firmly to the support. Furthermore, the support must have a hydrophilic surface, and the repelling effect thereof with respect to oleophilic printing inks must not decrease under the multiple printing commercial requirements. The support should have a surface structure which is porous so that the surface can retain sufficient water to have an adequate oil repelling effect with respect to the printing inks.

Aluminum oxide layers prepared by anodic oxidation of aluminum sheets or foils are extraordinarily abrasion resistant, and such anodized sheets have been found to be very useful in the production of long running printing plates. However, such plates suffer from disadvantages caused by too great a penetration of the radiation-sensitive composition into the pores of the anoidic oxide support.

In the past such disadvantages have been obviated, for example, by treating the anodized support with an aqueous solution of sodium silicate, ammonium or alkali bichromate, iron ammonium oxalate or a dyestuff which can react chemically with the aluminum oxide surface prior to coating the latter with the radiation-sensitive composition.

Such processes also suffer from certain disadvantages. Thus, treatment with alkali metal silicate entails the requirement of thorough rinsing with water when the support is to be provided with a storable radiation-sensitive layer adapted to be stored over a long period without deterioration of the radiation-sensitive layer. Even after thorough rinsing with water or neutralization with dilute acids, the alkali metal silicate layer or perhaps the alkali residue remaining from the silicate solution may undergo undesirable degradation. When aqueous chromate solutions are used, a barely hydrophilic intermdiate layer is obtained. Furthermore, the use of chromium-containing compositions is now considered environmentally undesirable. Similar considerations, except for the environmental, apply to treatment with an iron ammonium oxalate solution, the iron content of which may cause a dark discoloration.

When using aqueous solutions of dyestuffs that chemically react with the aluminum oxide surface, the hydrophilic properties of the aluminum oxide layer are reduced. Consequently, a printing plate material produced with a support treated in this manner tends to scum more during printing. In addition, the aluminum oxide surfaces chemically altered by means of dyestuffs cannot be easily corrected.

The patent to Herting et al. constituted an improvement over the prior art processes insofar as it treated an anodized support material with an alkali metal salt of a condensed arylsulfonic acid, such as Tamol SN, having an acidic pH. It has now been found that the aqueous solution having the acidic pH has to be constantly monitored and maintained by adding by the addition of an acid such as sulfuric or phosphoric acids. It was also found that in an acidic aqueous solution of the alkali metal salts of condensed arylsulfonic acids the pH of the solution increased significantly when the alkali metal salt concentrations decreased while operating at higher temperatures and over an extended period of time, e.g. from 11 to 75 hours or longer.

For certain purposes, it would be helpful to have available a process of applying the alkali metal salt of the arylsulfonic acids to the lithographic metal plate which did not require the monitoring and maintenance when one utilizes an acidic aqueous solution of such alkali metal salts. It would also be helpful in this connection to have available a method where the pH did not increase rapidly during the processing conditions.

SUMMARY OF THE INVENTION

In accordance with the present invention it has been found that if the aqueous interlayering solution containing the alkali metal salt of a condensed arylsulfonic acid has approximately a neutral pH, the need for monitoring and maintaining the pH is significantly decreased as compared to when an acidic pH has to be maintained in accordance with the method of U.S. Pat. No. 4,446,221. It has also been found that when one starts with approximately a neutral pH, in contrast to an acidic pH, the increase of the pH during processing is significantly decreased. The latter is another operational advantage.

One object of the present invention therefore is to provide a novel method for preparing lithographic printing plates using an interlayer comprising an alkali metal salt of a condensed arylsulfonic acid.

This and other objects of the present invention will be more fully understood by reference to the following detailed description of the invention as well as the illustrative embodiments.

DETAILED DESCRIPTION OF THE INVENTION

The arylsulfonic acid salts useful according to the instant invention include the naphthalene sulfonates in which two or more naphthalene nuclei are joined by alkylene groups. The prototype of this class is dinaphthylmethanedisulfonic acid, the disulfonic acid having a formula as follows:

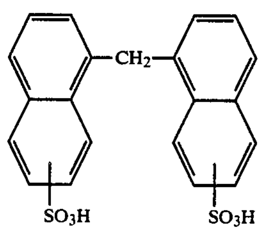

Products of this class are of indefinite composition. They may be manufactured by heating naphthalene, formaldehyde, and sulfuric acid together, or by treating naphthalene sulfonic acids with formaldehyde. Thus, there or more naphthalene nuclei may be joined together by alkylene groups to yield a condensation polymer. Lower alkylated naphthalenes may also be used in the reaction. An example is monoisopropylnaphthalene. In the place of naphthalene, other aromatic hydrocarbons may be employed such as benzene, diphenyl, anthracene, phenanthrene, fluorene, etc., or homologues or derivatives thereof. The salts of the foregoing acids, such as the sodium salts possess similar properties. The production of dispersing agents of this type is described in detail in the literature and in prior art patents including U.S. Pat. No. 2,802,845 and representative compounds are available commercially under the trademarks Tamol, Daxad, Lomar, Demol, Lavelin, Disrol, Escol, and Runox, etc. Some products have a low pH, e.g. close to neutral. The pH of these compounds is very much dependent on their manufacturing process.

Particularly useful for the instant invention are the sodium salts of condensed naphthalene sulfonic acids known as Tamol SN and Tamol N Micro which are available commercially from Rohm & Haas, as well as Lomar PW and Lomar LS-1 from Diamond Shamrock.

The support material may be any of those known in the art including aluminum and its alloys. A preferred support material is selected from aluminum metal and its lithographically suitable alloys. If desired, the support material may be subjected to one or more treatments during or after said anodization treatment with one or more treatments such as graining, e.g., chemical, mechanical and/or electrochemical; degreasing; desmutting, and the like.

The anodization may be effected in any manner known in the art including immersion of the substrate in an aqueous bath comprising sulphuric acid, phosphoric acid, and the like as well as mixtures thereof, and subjecting it to a current density in an AC or DC field.

According to one embodiment of the invention, an anodized support material is prepared by subjecting a metal sheet or web which may have been pretreated as indicated above, to a current density of about 1 to about 10 $A/dm^2$ at about 10 to about 100 volts DC, in an aqueous acid bath having an acid concentration of from about 5 to 30% wt. for about 5 seconds up to 60 minutes and preferably about 0.5 to 5 minutes. The resulting anodized support is then treated with an aqueous solution of the alkali salt of the condensed arylsulfonic acid whose concentration is from about 0.5 to 45%, and preferably from about 5 to 10% wt. The sulfonic acid solution is adjusted to an approximately neutral pH. In general the pH may vary from about 7 to 7.9. Ambient or room temperatures are preferred but treatment temperatures up to 50° C., can be utilized effectively.

The anodization is most preferably effected in a bath of about 20% wt. aqueous $H_2SO_4$ at about 2.6 $A/dm^2$ and about 20 volts DC for about 1 minute. The condensed arylsulfonic acid comprises about 7.5% by weight of the aqueous treating solution, which is applied to the anodized metal support material by any means such as dipping, sponging, and squeegeeing.

According to the instant invention there is also provided an improved radiation-sensitive element which comprises any of the improved supports upon which has been coated any radiation-sensitive composition as known in the art, e.g., positive-acting compositions, such as are described e.g., in U.S. Pat. No. 4,189,320 (issued Feb. 19, 1980) and 3,785,825 (issued Jan. 16, 1974) and negative-acting compositions, such as are described, e.g. in U.S. Pat. No. 3,382,069 (issued May 7, 1968). Said coatings are applied to the support material by any method known to the art including which coating, meniscus coating, and the like.

It has been found advantageous to rinse the plate with water after it has been subjected to interlayering step for better adhesion to the radiation-sensitive layer without losing the desirable characteristics of anti-staining and anti-scuming. The instant invention also provides a method for the preparation of improved lithographic printing plates which comprises the steps of imagewise exposing any of the above elements, in accordance with the invention, to radiation through a mask, development of said imagewise exposed element to remove the more soluble areas of the coating and, if desired, post-treating the developed element to produce a desirable lithographic printing plate.

The methods for exposure, development and post-treatment of the elements may be any of those known in the art including for example, the post-curing procedure described in U.S. Pat. No. 4,233,390 issued Nov. 11, 1980.

The following embodiment is illustrative only and are not meant to limit the present invention.

EXAMPLE

A pumice slurry grained aluminum sheet was alkaline etch, desmutted, and then anodized in sulfuric acid. Between the foregoing treatments cold water rinsing was also performed. The above treated aluminum base was then with/without dipped in a solution containing alkali metal salt of a condensed aryl sulfonic acid at temperatures from room temperature to 50° C. and a pH of about 7 with or without adjusting by sulfuric acid depending on various trademark products.

After the above treatment, the sheet was rinsed, dried, and then coated with a radiation-sensitive composition comprising 63.4 parts of an alkali-soluble phenolic resin (Alnoval PN-430), 33 parts of the reaction product of 2-diazo-1,2-naphthoquinone-5-sulfonyl chloride with a phenolic resin (the same Alnoval PN-430), 2 parts of a polyurethane resin, and 1.6 parts of acid-sensitive organic dye by weight dissolved in 30 parts of methyl isobutyl ketone, 30 parts of primary amyl acetate, 20 parts of methyl ethyl ketone and 20 parts of ethylene glycol monoethyl ether by volume was applied to the plate and processed in the conventional manner. After treatment with a conventional image remover and washed with water, the plate was rubbed with water and black ink. The difference in background between the area of image remover and those areas untreated can be measured using a MacBeth reflectance densitometer, provided with black filter on plates that are acceleratedly aged at 55° C. The optical density between these two areas indicates the degree of staining. The lower difference in optical density, the lesser degree of staining. The difference in optical density (Delta O.D.) was as follows:

| Interlayer Treatment | Delta O.D. of plates (Aged at 55° C. × 1 day) | Delta O.D. of plates (Aged at 55° C. × 5 days) |
|---|---|---|
| a. without dipped plate | 0.10 | 0.08 |
| b. pH = 7 dipped plate | 0.00 | 0.01 |

The staining on the thus produced plate was found to be superior to those plates without interlayer treatment.

Although the illustrative embodiment set forth above describes the main features of the present invention, it will be understood that the invention is subject to variations and modifications without departing from the broader aspects.

What is claimed is:

1. In a method for preparing a lithographic printing plate comprising the following sequential steps:

(a) treating a support material of aluminum or an aluminum alloy with an aqueous solution of an alkali metal salt of a condensed arylsulfonic acid having two or more arylsulfonic acid nuclei joined by alkylene groups, said treatment being effected at a temperature of from about room temperature to 50° C. during or after anodization of said support material;

(b) coating the thus treated anodized support material with a radiation-sensitive composition to obtain a radiation-sensitive element;

(c) exposing the radiation-sensitive element to radiation through a mask; and (d) developing the resulting exposed element to remove areas of greater solubility to produce said lithographic printing plate; the improvement which comprises utilizing in step (a) an aqueous solution of an alkali metal salt of a condensed arylsulfonic acid, which has two or more arylsulfonic acid nuclei joined by alkylene groups, having a pH of about 7.0 to about 7.9.

2. In the method of claim 1 wherein the pH of said aqueous solution is about 7.

3. In the method of claim 1 wherein the thus treated anodized support obtained from step (a) is rinsed with water prior to coating step (b).

* * * * *